United States Patent
Dudek et al.

(10) Patent No.: US 7,504,692 B2
(45) Date of Patent: Mar. 17, 2009

(54) HIGH-VOLTAGE FIELD-EFFECT TRANSISTOR

(75) Inventors: Volker Dudek, Brackenheim (DE); Michael Graf, Leutenbach (DE); Stefan Schwantes, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 92 days.

(21) Appl. No.: 11/518,449

(22) Filed: Sep. 11, 2006

(65) Prior Publication Data

US 2007/0262376 A1 Nov. 15, 2007

(30) Foreign Application Priority Data

Sep. 9, 2005 (DE) .................. 10 2005 042 827

(51) Int. Cl.
*H01L 29/94* (2006.01)
(52) U.S. Cl. ............... 257/341; 257/288; 257/336; 257/E29.256; 438/269
(58) Field of Classification Search ............ 257/336, 257/288, E29.256; 438/269
See application file for complete search history.

(56) References Cited

U.S. PATENT DOCUMENTS

| | | | |
|---|---|---|---|
| 5,134,447 A | 7/1992 | Ng et al. | |
| 5,300,448 A * | 4/1994 | Merchant et al. | 438/163 |
| 5,698,869 A | 12/1997 | Yoshimi et al. | |
| 6,239,463 B1 | 5/2001 | Williams et al. | |
| 6,531,748 B2 | 3/2003 | Pfrisch | |
| 6,787,883 B1 | 9/2004 | Forbes | |
| 6,828,632 B2 | 12/2004 | Bhattacharyya | |
| 2003/0071291 A1 | 4/2003 | Beasom | |
| 2004/0180485 A1* | 9/2004 | Beasom | 438/197 |

FOREIGN PATENT DOCUMENTS

| | | |
|---|---|---|
| JP | 6-013561 | 1/1994 |
| JP | 7-335887 | 12/1995 |

OTHER PUBLICATIONS

Definition of Adjacent, Merriam-Webster Online Dictionary.*

* cited by examiner

*Primary Examiner*—Wael Fahmy
*Assistant Examiner*—Tucker Wright
(74) *Attorney, Agent, or Firm*—Muncy, Geissler, Olds & Lowe PLLC

(57) ABSTRACT

High-voltage field-effect transistor is provided that includes a drain terminal, a source terminal, a body terminal, and a gate terminal. A gate oxide and a gate electrode, adjacent to the gate oxide, is connected to the gate terminal. A drain semiconductor region of a first conductivity type is connected to the drain terminal. A source semiconductor region of a first conductivity type is connected to the source terminal. A body terminal semiconductor region of a second conductivity type is connected to the body terminal. A body semiconductor region of the second conductivity type, is partially adjacent to the gate oxide to form a channel and is adjacent to the body terminal semiconductor region. A drift semiconductor region of the first conductivity type is adjacent to the drain semiconductor region and the body semiconductor region, wherein in the drift semiconductor region, a potential barrier is formed in a region distanced from the body semiconductor region.

14 Claims, 3 Drawing Sheets

HIGH-VOLTAGE FIELD-EFFECT TRANSISTOR

This nonprovisional application claims priority under 35 U.S.C. § 119(a) on German Patent Application No. DE 102005042827, which was filed in Germany on Sep. 9, 2005, and which is herein incorporated by reference.

BACKGROUND OF THE INVENTION

1. Field of the Invention

The present invention relates to a high-voltage field-effect transistor and to a method for manufacturing a high-voltage field-effect transistor.

2. Description of the Background Art

U.S. Pat. No. 5,698,869 discloses a semiconductor structure and the manufacture of a semiconductor structure, in which the leakage current is reduced and the breakdown voltage is increased for an insulated-gate transistor, such as a MOSFET. A semiconductor region with a reduced bandgap for silicon, such as $Si_xGe_{1-x}$, $Si_xSn_{1-x}$, or PbS, is formed in an interior area of a source region or a drain region of an SOI component. To effectively suppress the potential-free body effect in an SOI component, the SiGe region must be formed sufficiently close to a pn junction between the source region and a channel region. In order to reduce the influence of crystal imperfections by the germanium atoms, it is proposed to form the region with the reduced bandgap up to the channel region.

In Japanese patent No. 06013561 A, germanium is implanted into the source and drain region of a MOSFET, so that the bandgap in the source region and in the drain region is reduced to lower a current gain of a parasitic bipolar transistor. U.S. Pat. No. 6,765,247 B2 shows a similar situation. In Japanese patent No. 7335887 A, moreover, a horizontal concentration distribution of germanium is achieved in two steps of germanium implantation in a conventional LDD process.

U.S. Pat. No. 6,828,632 B2 relates to an SOI structure. A well region is formed above an oxide layer. The well region is applied epitaxially in several layers, whereby the layers have a silicon-germanium layer. The silicon-germanium layer has a number of recombination centers in the source/drain region.

U.S. Pat. No. 6,787,883 B1 discloses the preparation of a $Si_{1-x}Ge_x$ layer in the channel region, which forms a $Si_{1-x}Ge_x$—Si heterojunction to the substrate. To reduce hot charge carriers, in U.S. Pat. No. 5,134,447, a heterojunction is formed in the vicinity of a pn junction in the body of a MOS transistor.

U.S. Pat. No. 6,531,748 B2 discloses a power component with a MOS structure. The source region in this case is formed of a material that has a lower bandgap than the material of a channel region in order to reduce a current gain of a parasitic bipolar transistor.

SUMMARY OF THE INVENTION

It is therefore an object of the present invention to provide a high-voltage field-effect transistor which has a drift semiconductor region.

Accordingly, a high-voltage field-effect transistor is provided. A high-voltage field-effect transistor is characterized by a drift semiconductor region. An electric field is created by application of a drain-source voltage above this drift semiconductor region, which is also called a drift zone. In order to form a high reverse voltage as a high-voltage field-effect transistor, the electrical field along the drift semiconductor region may not exceed the maximum value.

Furthermore, the high-voltage field-effect transistor has a drain terminal, a source terminal, a body terminal, and a gate terminal. A gate oxide and a gate electrode adjacent to the gate oxide, which is connected to the gate terminal, enable control of the high-voltage field-effect transistor.

A drain semiconductor region of the first conductivity type is connected to the drain terminal. A source semiconductor region of the first conductivity type is connected to the source terminal. A body terminal semiconductor region of a second conductivity type, opposite to the first conductivity type, is connected to the body terminal. A body semiconductor region of the second conductivity type, which is partially adjacent to the gate oxide to form a channel, is moreover adjacent to the body terminal semiconductor region.

The drift semiconductor region of the first conductivity type is adjacent to the drain semiconductor region and to the body semiconductor region. In a high-voltage field-effect transistor, the effective length of the drift semiconductor region in this case is twice or multiples of the length of the channel region.

In the drift semiconductor region, a potential barrier is formed in a region spatially distant from the body semiconductor region. The distance between this region in the drift semiconductor region and the body semiconductor region is thereby sufficiently large, when in the case of an applied drain-source voltage an interaction between the pn junction and the potential barrier can be neglected.

An embodiment of the invention provides that, to form the potential barrier, the bandgap is made smaller in this region than in other regions of the drift semiconductor region. The bandgap, which is also called an energy gap or band distance, is 1.12 eV, for example, for silicon. If, for example, germanium is introduced into this region to form the potential barrier, the bandgap can be reduced to a value between 0.67 eV (Ge) and 1.1 eV for a silicon-germanium mixed crystal (SiGe). The potential barrier preferably has an abrupt change in the valence band for an N-DMOS field-effect transistor.

The abrupt change in the valence band in this case is made in such a way that holes flowing in the direction of the body semiconductor region are predominantly stopped. In contrast, the potential barrier for a PDMOS field-effect transistor has an abrupt change in the conduction band. The abrupt change in the conduction band in this case is made in such a way that electrons flowing in the direction of the body semiconductor region are more or less stopped. Basically, according to the invention, other semiconductors can also be used, such as gallium arsenide (GaAs) or silicon carbide (SiC).

According to a further embodiment of the invention, the drift semiconductor region has single-crystal silicon. Germanium atoms are introduced in this region with the potential barrier into the single-crystal silicon of the drift semiconductor region. In this case, the concentration of the germanium atoms declines in the direction of the drain semiconductor region. The declining concentration of germanium has the result that in the case of an N-DMOS field-effect transistor electrons are not impeded by a potential barrier, so that the on-resistance of the high-voltage field-effect transistor remains low.

In yet a further embodiment of the invention, the high-voltage field-effect transistor has a field oxide that is several times thicker than the gate oxide. The region with the potential barrier is preferably adjacent to the field oxide within the drift semiconductor region.

According to another embodiment of the invention, the high-voltage field-effect transistor has a buried insulating layer. This insulating layer is made, for example, of silicon dioxide. To bury this insulating layer, for example, a first wafer and a second wafer with a covering layer of silicon dioxide can be bonded to one another. Preferably, the region with the potential barrier can be adjacent to the buried insulating layer. In addition to the insulating layer, which insulates the high-voltage field-effect transistor from a substrate, the field-effect transistor can be insulated by a trench filled with an insulation material from components laterally adjacent on the chip.

In addition, to form the potential barrier, another potential barrier is formed in the source semiconductor region and/or in the drain semiconductor region. This additional potential barrier can produce other physical effects to increase the breakdown voltage or to reduce the on-resistance.

Furthermore, the object of the invention is achieved by a method for the manufacture of a high-voltage field-effect transistor. In this case, a drift semiconductor region and a body semiconductor region are made of a first semiconductor material. In the drift semiconductor region, a second semiconductor material is introduced to form a potential barrier in such a way that a concentration of the second semiconductor material in the first semiconductor material decreases in the direction of a drain semiconductor region.

To effect a decreasing concentration of the second semiconductor material, for example, germanium, an embodiment of the invention provides that implantation masking is used. An implantation with this preferably slit implantation mask enables the formation, lateral relative to a surface of the water to be processed, of the decreasing concentration of the second semiconductor material in the drift semiconductor region.

According to another embodiment of the invention, a vertical formation of a concentration gradient is provided. In order to create this concentration gradient, vertical relative to a surface of the wafer to be processed, with a declining concentration of the second semiconductor material, a supply of the second semiconductor material is changed during an epitaxial deposition.

A further embodiment of the invention provides that substantially immediately after the potential barrier, a field oxide adjacent to the potential barrier is formed. This field oxide can thereby be created by oxidation of the first semiconductor material, for example, silicon, or by deposition of an oxide.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
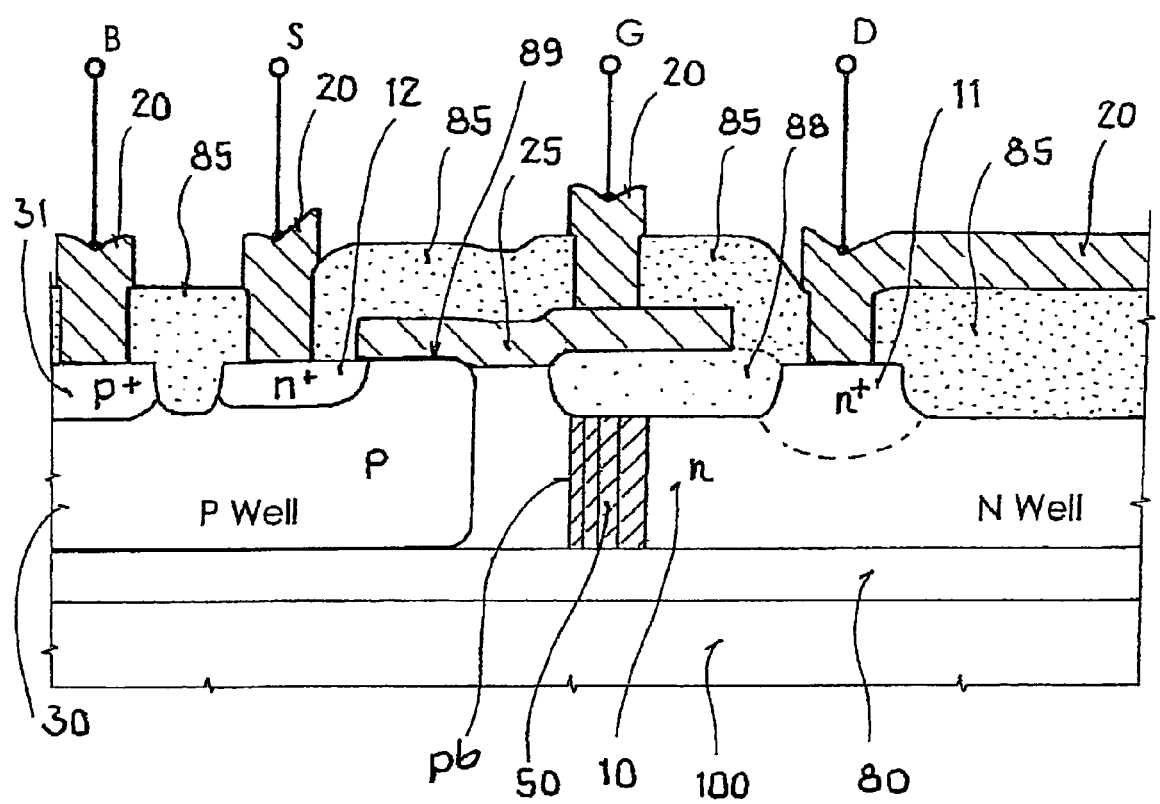
FIG. 1 is a schematic sectional view through a high-voltage field-effect transistor.

A sectional view through a high-voltage field-effect transistor is shown schematically in FIG. 1. The high-voltage field-effect transistor has terminals, drain D, gate G, source S, and body B, each of which have a metal structure 20 for connection by traces. In this case, the source terminal S and the body terminal B can be shorted via a metal trace. Metal structures 20 are connected, for example, via a silicide layer, not shown in FIG. 1, to a semiconductor region 11, 12, 25, and 31 of the high-voltage field-effect transistor. Metal structure 20 of gate terminal G is thereby adjacent to gate electrode 25, which is made of high-doped polycrystalline silicon.

An N-DMOS field-effect transistor is shown as an example in FIG. 1. Metal structure 20 of drain terminal D is connected, for example, via a silicide to a drain semiconductor region 11. Drain semiconductor region 11 is n-doped in this case. Source semiconductor region 12, which is connected to metal structure 20 of source terminal S, is also n-doped.

The metal structure of body terminal B is connected to a high-doped body terminal semiconductor region 31. Body terminal semiconductor region 31 is p-doped in this case. Furthermore, body semiconductor region 30, which is adjacent to body terminal semiconductor region 31, is p-doped. Furthermore, body semiconductor region 30 extends under a thin gate oxide 89, which is formed under gate electrode 25. Body semiconductor region 30 is also designated as a pwell in FIG. 1. Body semiconductor region 30 in addition forms a pn junction to source semiconductor region 12.

Another pn junction is formed between body semiconductor region 30 and a drift semiconductor region 10. Drift semiconductor region 10 is also called a drift zone and also designated as an nwell in FIG. 1. If a gate voltage is applied between gate terminal G and source terminal S below a threshold voltage of the high-voltage field-effect transistor, a reverse voltage declines in the reverse direction via the pn junction between body semiconductor region 30 and drift semiconductor region 10.

N-DMOS transistors are physically damaged when a parasitic bipolar transistor is triggered because of a high voltage applied between drain terminal D and source terminal S connected to body terminal B. The parasitic bipolar transistor in FIG. 1 is formed by drift semiconductor region 10 as a parasitic collector region, by body semiconductor region 30 as a parasitic base region, and by source semiconductor region 12 as the parasitic emitter region.

Because of the high applied drain source voltage, in this case a dramatic increase in the drain current can occur, which can no longer be controlled by the gate potential. The uncontrolled current flow ultimately leads to the thermal degradation of the component. The parasitic bipolar transistor in this case is controlled by a hole current. For example, charge carriers generated at crystal defects are accelerated by an electrical field in the space charge region, which forms along drift semiconductor region 10 between drain semiconductor region 11 and the pn junction (body semiconductor region 30/drain semiconductor region 10).

An electron-hole pair can again be generated by impact ionization. Here, the electrons wander to drain semiconductor region 11, but the holes flow across body semiconductor region 30 and further across body terminal semiconductor region 31. If the voltage drop at source semiconductor region 12, caused by the hole current in the direction of body terminal semiconductor region 31, is sufficient to switch the source semiconductor region-to-body semiconductor region pn junction in the direction of flow, the parasitic bipolar transistor is triggered.

The voltage applied between drain terminal D and the shorted source terminal D and body terminal B must therefore always remain below a critical value, so that the voltage drop caused by the generated charge carriers is not sufficient to polarize the pn junction between source semiconductor region 12 and body semiconductor region 30 in the direction of flow.

A region 50 with a potential barrier pb is formed within drift semiconductor region 10. The hole current from drift semiconductor region 10 to body semiconductor region 30 is suppressed by potential barrier pb. In region 50 the bandgap is locally reduced by the germanium atoms introduced into the silicon. However, outside region 50 the silicon bandgap between the conduction band and valence band is not reduced.

Region 50 and thereby potential barrier pb are formed outside drain semiconductor region 11, outside body semiconductor region 30, and outside source semiconductor region 12. In addition, region 50 with the introduced germanium atoms is distanced from body semiconductor region 30. Furthermore, region 50 is distanced from gate oxide 89. Preferably, the distances are in the range of 200 nm. The exemplary embodiment in FIG. 1 is thereby not shown to scale.

FIG. 1 shows a field oxide 88, which is thicker than gate oxide 89, whereby region 50 and thereby potential barrier pb are adjacent to field oxide 88. Drift semiconductor region 10 and body semiconductor region 30, moreover, are adjacent to a buried oxide layer 80 (SOI). Advantageously, region 50 and preferably also potential barrier pb are also adjacent to buried oxide layer 80.

Instead of the N-DMOS shown in FIG. 1, the same applies to the P-DMOS analog. In this case, the conductivity types n and p, shown in FIG. 1, can be interchanged.

Figure 2:
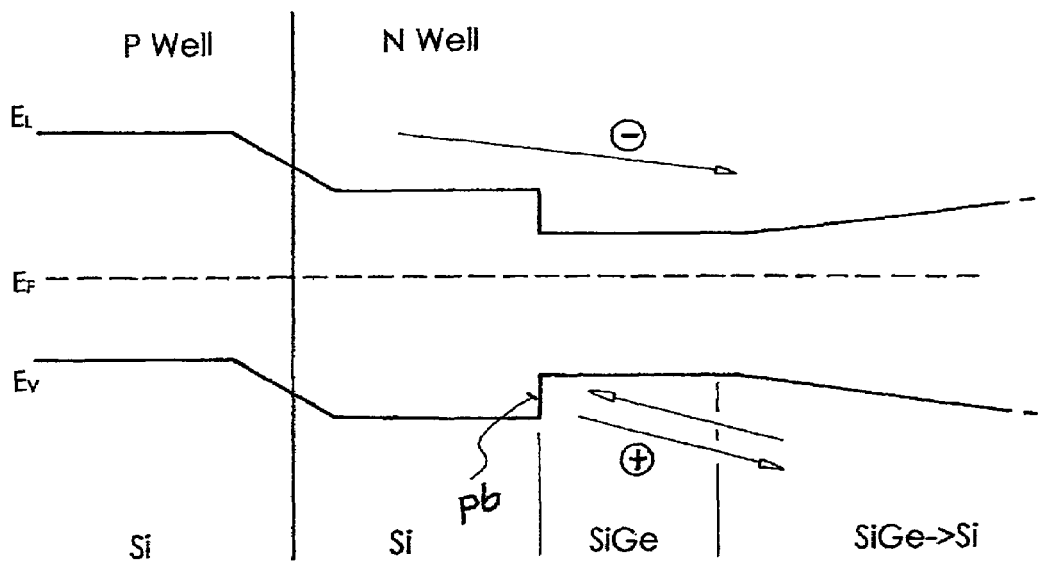
FIG. 2 is a schematic band model with the potential barrier formed in FIG. 1.

A simplified band model with a conduction band $E_L$, a valence band $E_V$, and a Fermi level $E_F$ without a voltage applied to drain terminal D is shown schematically in FIG. 2. The p-doped body semiconductor region pwell 30 is shown on the left in FIG. 2. The perpendicular line shows the pn junction between body semiconductor region pwell 30 and adjacent drift semiconductor region nwell 10. The distances of the conduction band $E_L$ and the valence band $E_V$ from the Fermi level $E_F$ change in the pn junction region. In this pn junction region, potential barrier pb is outside region 50 and is thereby formed in a silicon crystal Si.

Furthermore, potential barrier pb is drawn in FIG. 2. In FIG. 2, to the right of potential barrier pb, therefore in the direction of drain semiconductor region 11, germanium Ge is introduced in region 50 into the silicon Si, so that a silicon-germanium mixed crystal SiGe is formed. This silicon-germanium mixed crystal SiGe has a smaller bandgap than the silicon crystal Si, as is shown in FIG. 2. The smaller bandgap of the silicon-germanium mixed crystal SiGe, which is adjacent to the silicon crystal Si, effects potential barrier pb. There is an abrupt transition from the region of the large bandgap in the silicon crystal Si to the region with the narrower bandgap in the silicon-germanium-mixed crystal SiGe.

The arising potential barrier pb thereby works exclusively in the valence band $E_V$ against a draining of the (+) holes to body semiconductor region 30 and body terminal semiconductor region 31. The jump in conduction band $E_L$ thereby does not have a negative effect on the electron current (−). In the direction of drain semiconductor region 11, the transition from the region of the narrow bandgap to the region of the larger bandgap occurs smoothly in order to avoid an electron potential barrier. Within a minimum distance in region 50, this is accomplished by a germanium Ge doping profile continuously declining in the direction of drain semiconductor region 11.

Figure 3:
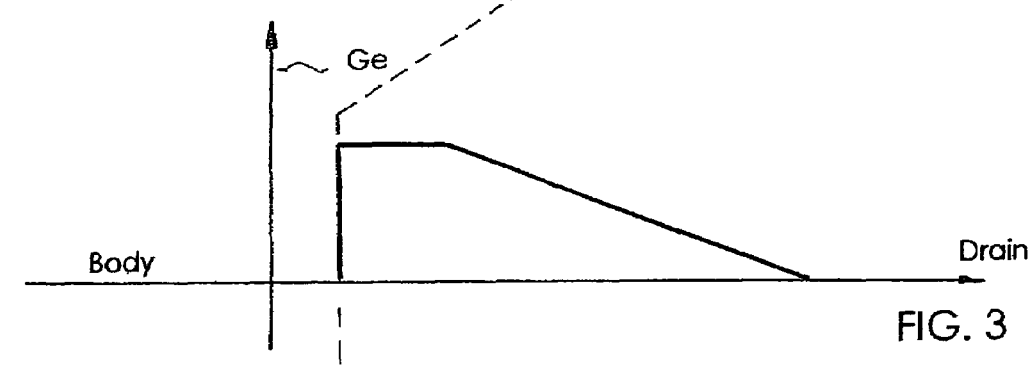
FIG. 3 is a schematic drawing of a lateral germanium concentration gradient in a silicon semiconductor material.
Figure 4:
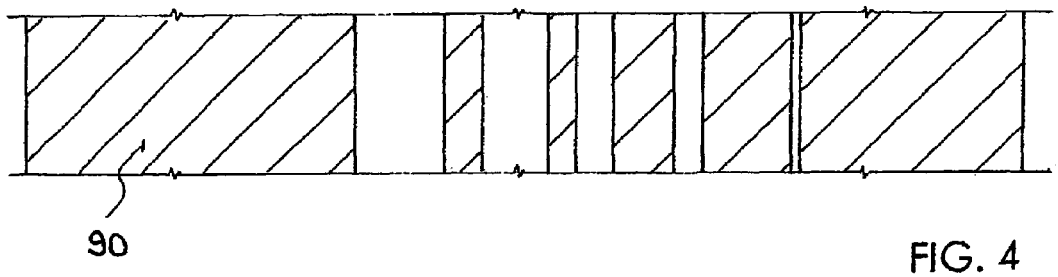
FIG. 4 is a schematic drawing of a masking to create a lateral gradient of a germanium concentration in a silicon semiconductor material.

An approximately linear doping profile is shown as an example in FIG. 3. To achieve this type of approximately linear doping profile, germanium atoms Ge are implanted through a slit masking 90, as is shown in FIG. 4, in drift semiconductor region 10. In a later high-temperature step, the distribution of the germanium Ge can still be changed, particularly linearized.

Figure 5:
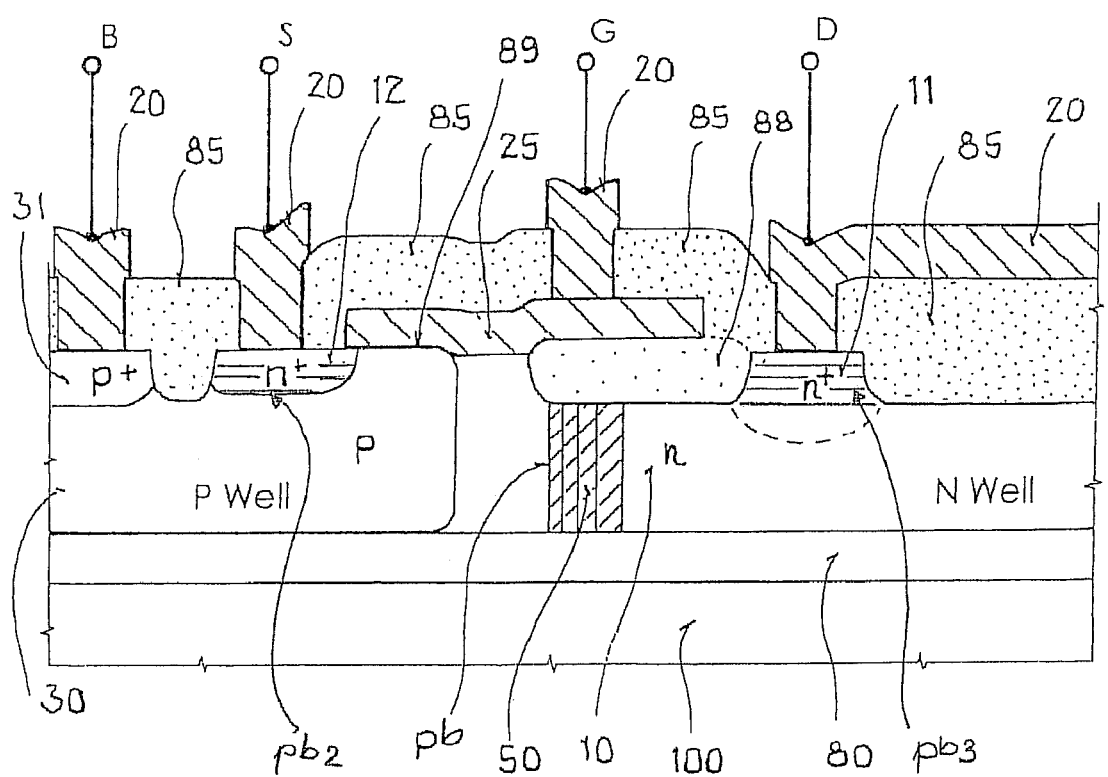
FIG. 5 is a schematic drawing illustrating a further exemplary embodiment of the present application.

FIG. 5 illustrates a further embodiment, whereby another potential barrier pb2 is formed in the source semiconductor region and/or in the drain semiconductor region.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. High-voltage field-effect transistor comprising:
 a drain terminal;
 a source terminal;
 a body terminal;
 a gate terminal;
 a gate oxide;
 a gate electrode provided adjacent to the gate oxide, the gate electrode being connected to the gate terminal;
 a drain semiconductor region of a first conductivity type that is connected to the drain terminal;
 a source semiconductor region of the first conductivity type which is connected to the source terminal;
 a body terminal semiconductor region of a second conductivity type that is connected to the body terminal;
 a body semiconductor region of the second conductivity type that is partially adjacent to the gate oxide to thereby form a channel and which is adjacent to the body terminal semiconductor region; and
 a drift semiconductor region of the first conductivity type that is adjacent to the drain semiconductor region and to the body semiconductor region,
 wherein a potential barrier is formed in the drift semiconductor region in a region distanced from the body semiconductor region.

2. The high-voltage field-effect transistor according to claim 1, wherein to form the potential barrier a bandgap is made smaller in this region with the potential barrier than in other regions of the drift semiconductor region.

3. The high-voltage field-effect transistor according to claim 2, wherein the drift semiconductor region has single-crystal silicon, and wherein germanium atoms are introduced in this region into the single-crystal silicon of the drift semiconductor region, and wherein in this region the concentration of the germanium atoms declines in the direction of the drain semiconductor region.

4. The high-voltage field-effect transistor according to claim 1, further comprising a field oxide, wherein the region with the potential barrier is adjacent to the field oxide.

5. The high-voltage field-effect transistor according to claim 1, wherein the potential barrier in the drift semiconductor region is near a surface relative to a chip face, in a upper half of the drift semiconductor region.

6. The high-voltage field-effect transistor according claim 1, further comprising a buried insulator layer that is formed of silicon dioxide, wherein the region with the potential barrier is adjacent to the buried insulating layer.

7. The high-voltage field-effect transistor according to claim 1, wherein, another potential barrier is formed in the source semiconductor region and/or in the drain semiconductor region.

8. High-voltage field-effect transistor comprising:
a drain terminal;
a source terminal;
a body terminal;
a gate terminal;
a gate oxide;
a gate electrode overlying the gate oxide, the gate electrode being connected to the gate terminal;
a drain semiconductor region of a first conductivity type that is connected to the drain terminal;
a source semiconductor region of the first conductivity type which is connected to the source terminal;
a body terminal semiconductor region of a second conductivity type that is connected to the body terminal;
a body semiconductor region of the second conductivity type extending under the gate oxide to thereby form a channel and being adjacent to the body terminal semiconductor region; and
a drift semiconductor region of the first conductivity type underlying the drain semiconductor region and contacting the body semiconductor region, and
a potential barrier in the drift semiconductor region spaced from the body semiconductor region.

9. The high-voltage field-effect transistor according to claim 8, wherein a bandgap in the region of the potential barrier is smaller than a bandgap in regions of the drift semiconductor region spaced from the potential barrier.

10. The high-voltage field-effect transistor according to claim 9, wherein the drift semiconductor region comprises single-crystal silicon having a germanium region having germanium atoms, and wherein a concentration of the germanium atoms in the germanium region declines in a direction of the drain semiconductor region.

11. The high-voltage field-effect transistor according to claim 8, further comprising a field oxide, wherein the potential barrier contacts the field oxide.

12. The high-voltage field-effect transistor according to claim 8, wherein the potential barrier in the drift semiconductor region is near a surface relative to a chip face, in a upper half of the drift semiconductor region.

13. The high-voltage field-effect transistor according claim 8, further comprising a buried insulator layer that is formed of silicon dioxide, wherein the potential barrier contacts the buried insulating layer.

14. The high-voltage field-effect transistor according to claim 8, including an additional potential barrier in the source semiconductor region or in the drain semiconductor region or in both the source semiconductor region and the drain semiconductor region.

* * * * *